(12) United States Patent
Ahn et al.

(10) Patent No.: US 7,504,659 B2
(45) Date of Patent: Mar. 17, 2009

(54) THIN FILM TRANSISTOR AND FLAT PANEL DISPLAY DEVICE INCLUDING THE SAME

(75) Inventors: Tack Ahn, Suwon-si (KR); Min-Chul Suh, Suwon-si (KR); Jae-Bon Koo, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 289 days.

(21) Appl. No.: 11/357,004

(22) Filed: Feb. 16, 2006

(65) Prior Publication Data

US 2006/0186410 A1  Aug. 24, 2006

(30) Foreign Application Priority Data

Feb. 18, 2005  (KR) .................. 10-2005-0013504

(51) Int. Cl.
    *H01L 29/04* (2006.01)
(52) U.S. Cl. .................. 257/57; 257/347; 257/622; 257/E29.117
(58) Field of Classification Search ............ 257/57, 257/72, 347, E27.111, E27.112, E29.117, 257/59, 368, 622
    See application file for complete search history.

(56) References Cited

U.S. PATENT DOCUMENTS 5,963,797 A * 10/1999 Hyun .................. 438/149
6,653,159 B2 * 11/2003 Wu .................... 438/30
6,803,983 B2 * 10/2004 Kwak et al. ............ 349/153
6,869,838 B2 *  3/2005 Law et al. .............. 438/207
2002/0115249 A1 *  8/2002 Seo et al. ............... 438/200
2004/0259029 A1 * 12/2004 Nagahara et al. ........ 430/270.1
2005/0023557 A1 *  2/2005 Okada et al. ............ 257/199

FOREIGN PATENT DOCUMENTS

JP    2000-077405     3/2000
KR    10-2001-0061779 A    7/2001

OTHER PUBLICATIONS

Notice to Submit Response by Korean Intellectual Property Office on Jul. 20, 2006.

* cited by examiner

*Primary Examiner*—Tuan N. Quach
(74) *Attorney, Agent, or Firm*—Knobbe Martens Olson & Bear LLP

(57) ABSTRACT

A thin film transistor including a stop layer is disclosed. In one embodiment, the thin film transistor includes a substrate, a gate electrode formed on the substrate, a source electrode and a drain electrode insulated from the gate electrode, a semiconductor layer insulated from the gate electrode and having: a channel region which is electrically connected to the source electrode and the drain electrode, and a groove for separating at least the channel region from adjacent thin film transistors, and a stop layer formed below the semiconductor layer. According to one embodiment of the invention, a semiconductor layer can be easily patterned without using a dry or wet etching technique such as photolithography.

19 Claims, 10 Drawing Sheets

THIN FILM TRANSISTOR AND FLAT PANEL DISPLAY DEVICE INCLUDING THE SAME

CROSS-REFERENCE TO RELATED PATENT APPLICATION

This application claims the benefit of Korean Patent Application No. 10-2005-0013504, filed on Feb. 18, 2005, in the Korean Intellectual Property Office, the disclosure of which is incorporated herein in its entirety by reference.

BACKGROUND OF THE INVENTION

1. Field of the Invention

The present invention relates to a thin film transistor and a flat panel display device including the same, and more particularly, to a thin film transistor of which a semiconductor layer can be easily patterned uniformly and a flat panel display device including the same.

2. Description of the Related Technology

A thin film transistor used in a flat panel display device such as a liquid crystal display device, an organic electroluminescent display device or an inorganic electroluminescent display device is used as a switching element for controlling the operation of a pixel and a driving element for driving the pixel.

The thin film transistor includes a source electrode and a drain electrode, a semiconductor layer including a channel region formed between the source electrode and the drain electrode, and a gate electrode which is insulated from the source electrode, the drain electrode and the semiconductor layer.

When thin film transistors having the above-mentioned structure are embodied in an array, each of the thin film transistors operates as an independent switching element. Accordingly, the semiconductor layer may be patterned so as to prevent crosstalk between adjacent thin film transistors. In a conventional silicon thin film transistor, a silicon semiconductor layer is patterned using photolithography.

Recently, as research into flexible display devices has increased, a plastic substrate has been used instead of a conventional glass substrate. However, the plastic substrate cannot be subjected to a high-temperature process.

Accordingly, a method of forming a thin film transistor on a plastic substrate at a low temperature has been suggested. Particularly, research has gone into organic thin film transistors which can be manufactured at a low temperature, that is, thin film transistors in which the semiconductor layer is formed of organic material. However, in an organic thin film transistor, the organic semiconductor layer cannot be patterned using a conventional photolithography. That is, if a wet or dry etching process accompanying the conventional patterning process is used, the organic semiconductor layer can be significantly damaged and thus the etching process cannot be used.

SUMMARY OF CERTAIN INVENTIVE ASPECTS

One aspect of the present invention provides a thin film transistor and a flat panel display device including the same in which a semiconductor layer can be easily patterned and a uniform patterning process can be realized.

Another aspect of the present invention provides a thin film transistor including i) a substrate, ii) a gate electrode formed on the substrate, iii) a source electrode and a drain electrode insulated from the gate electrode, iv) a semiconductor layer insulated from the gate electrode and having: a channel region which is electrically connected to the source electrode and the drain electrode, and a groove for separating at least the channel region from adjacent thin film transistors, and v) a stop layer formed below the semiconductor layer.

In one embodiment, the depth of the groove may be greater than the thickness of the semiconductor layer and may be less than the sum of the thickness of the semiconductor layer and the thickness of the stop layer.

In one embodiment, the stop layer may be formed only below the groove and a periphery thereof.

In another embodiment, the stop layer may be formed on the entire surface of the substrate except for a region between the source electrode and the drain electrode where the channel region is formed.

In another embodiment, the stop layer may be formed on the entire surface of the substrate except for regions corresponding to end portions of the source electrode and the drain electrode, the end portions facing each other.

In another embodiment, the depth of the groove may be substantially equal to the sum of the thickness of the semiconductor layer and the thickness of the stop layer.

In still another embodiment, the stop layer may be formed on the entire surface of the substrate except for the groove and a region between the source electrode and the drain electrode where the channel region is formed.

In still another embodiment, the stop layer may be formed on the entire surface of the substrate except for the groove and regions corresponding to end portions of the source electrode and the drain electrode, the end portions facing each other.

In one embodiment, the groove may form a closed curve.

In one embodiment, the channel region may be located inside the closed curve.

In another embodiment, the groove may form at least a pair of parallel lines.

In another embodiment, the channel region may be located between the at least one of the pairs of the parallel lines.

In one embodiment, the semiconductor layer may be formed of an organic material.

One embodiment of the invention further includes a gate insulating film covering the gate electrode to insulate the source electrode, the drain electrode and the semiconductor layer from the gate electrode, wherein the source electrode, the drain electrode and the channel region may be formed on the gate electrode, and wherein the semiconductor layer may cover the source electrode and the drain electrode.

Another embodiment of the invention further includes a gate insulating film that insulates the gate electrode from the semiconductor layer and is interposed between the gate electrode and the semiconductor layer, wherein the semiconductor layer may cover the source electrode and the drain electrode, and wherein the gate electrode may be formed on the semiconductor layer.

Another aspect of the present invention provides a flat panel display device comprising the above-mentioned thin film transistor.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Embodiments of the present invention will now be described more fully with reference to the accompanying drawings, in which exemplary embodiments of the invention are shown.

As mentioned above, if an organic semiconductor layer is patterned using a conventional wet or dry etching method, the organic semiconductor layer is damaged and thus the conventional etching method cannot be used. In order to solve this problem, one embodiment of the present invention obtains a patterning effect by forming a groove in the organic semiconductor layer using a laser ablation technique (LAT). The present invention can be applied when using various other materials instead of the organic material to form the semiconductor layer.

Figure 1:
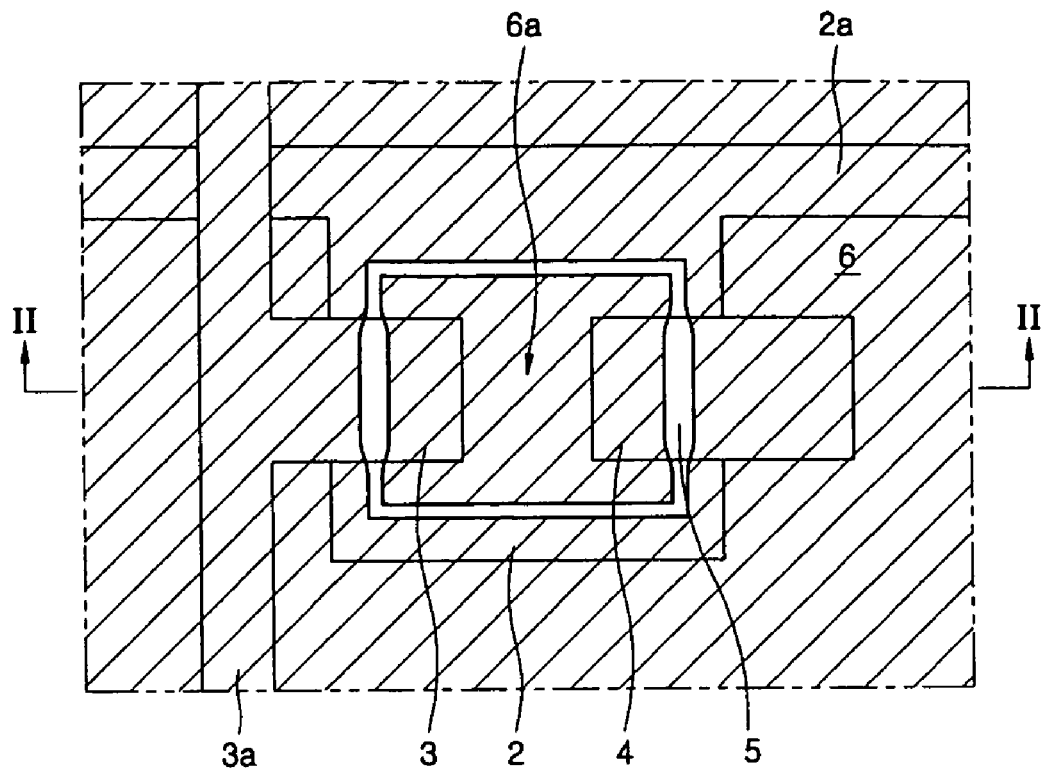
FIG. 1 is a plan view of an inverted coplanar thin film transistor manufactured using a laser ablation technique.
Figure 2:
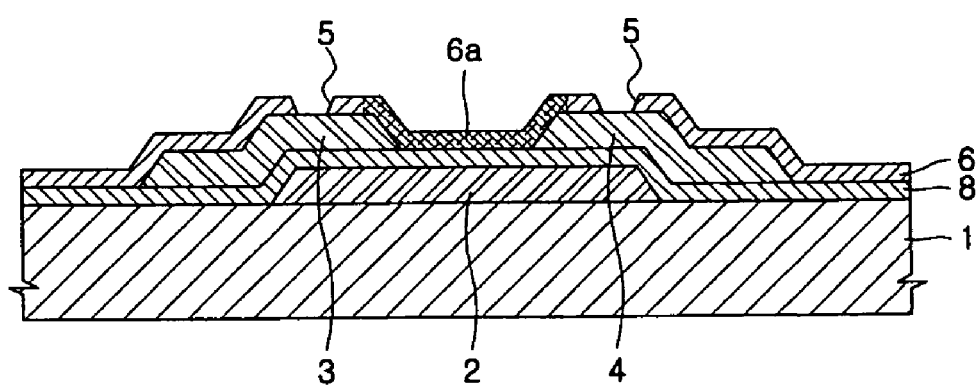
FIG. 2 is a cross-sectional view taken along a line II-II of FIG. 1.

FIG. 1 is a plan view of an inverted coplanar thin film transistor manufactured using the laser ablation technique, and FIG. 2 is a cross-sectional view taken along a line II-II of FIG. 1.

Referring to FIGS. 1 and 2, a gate electrode 2 is formed on a substrate 1 and a gate insulating film 8 is formed to cover the gate electrode 2. A gate wire 2a is used to apply a gate signal to the gate electrode 2. A wire 3a is connected to the source electrode 3. A source electrode 3 and a drain electrode 4 are formed on the gate insulating film 8 and a semiconductor layer 6 is formed to cover the source electrode 3 and the drain electrode 4. At this time, a groove 5 for separating a channel region 6a of the semiconductor layer 6 from adjacent thin film transistors (not shown) is formed. Various modifications, such as that the channel region 6a may be formed only when the thin film transistor operates, can be made. Also, such modifications can be made in the embodiments and modifications as discussed below.

In one embodiment, the groove 5 can be formed by radiating a laser onto a predetermined region of the semiconductor layer 6 to remove the predetermined region.

However, in this situation, the material below the predetermined region of the semiconductor layer 6 onto which the laser is radiated can vary. That is, when radiating the laser onto the region of the semiconductor layer 6 above the source electrode 3 and the drain electrode 4, the laser reaches a metal layer (that is, the source 3 or drain electrode 4). Furthermore, when radiating the laser onto another region of the semiconductor layer, the laser reaches the gate insulating film 8. Since material below the semiconductor layer 6 varies according to where the laser is radiated, the groove 5 does not have a uniform width or a uniform depth. Thus, the thin film transistor may fail to properly operate or the characteristics of the thin film transistor may not be uniform. Accordingly, in order to prevent these problems, one embodiment of the invention provides a stop layer formed below the semiconductor layer 6.

Figure 3:
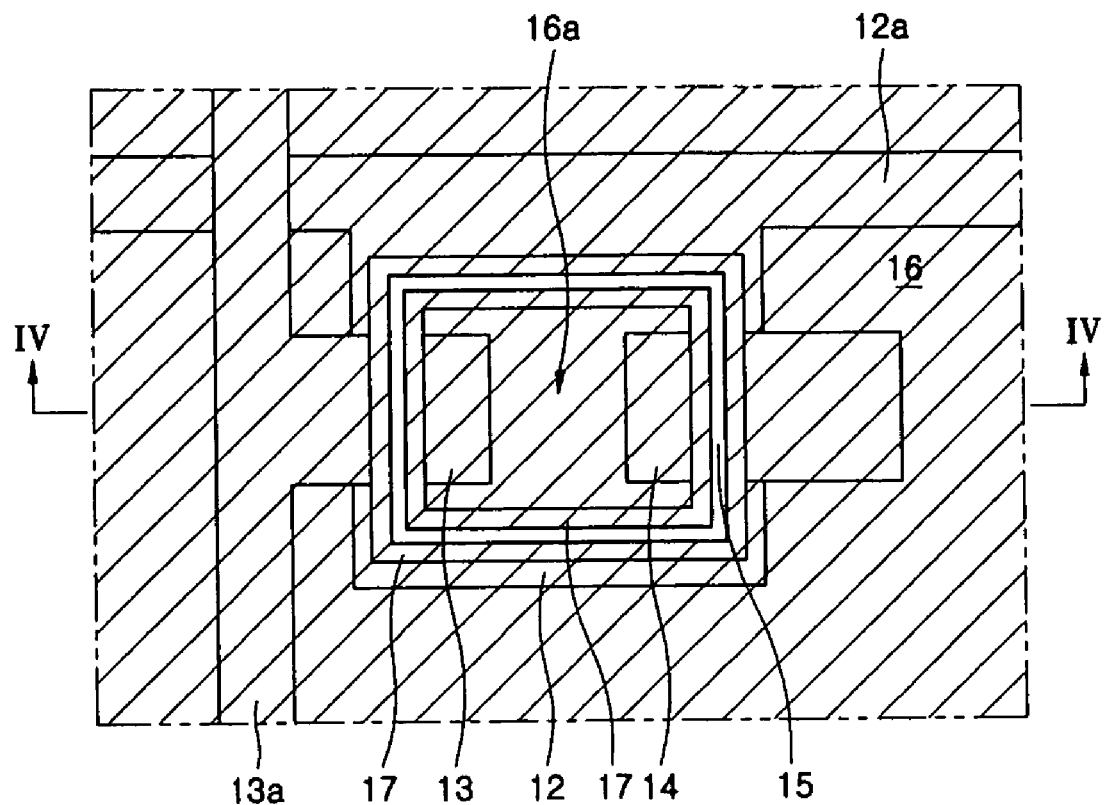
FIG. 3 is a plan view of an inverted coplanar thin film transistor according to an exemplary embodiment of the present invention.
Figure 4:
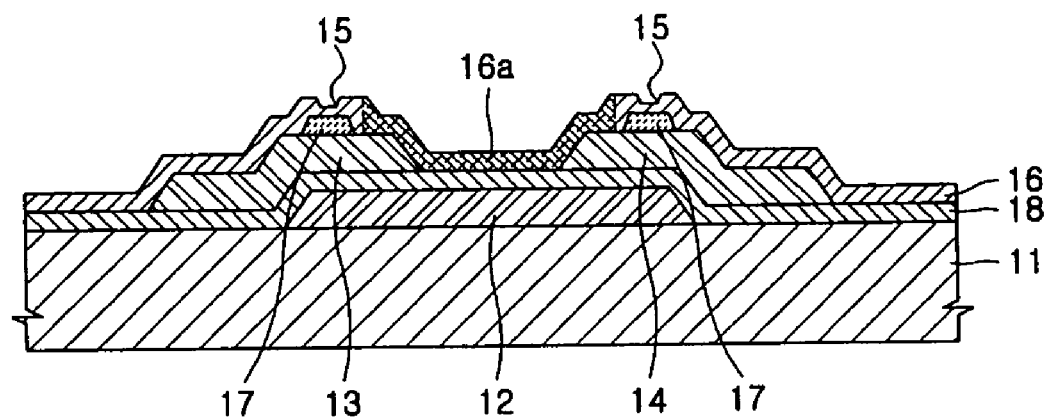
FIG. 4 is a cross-sectional view of the thin film transistor along a line IV-IV of FIG. 3.

FIG. 3 is a plan view of an inverted coplanar thin film transistor according to a first embodiment of the present invention and FIG. 4 is a cross-sectional view of the thin film transistor along a line IV-IV of FIG. 3.

Referring to FIGS. 3 and 4, a gate electrode 12 is formed on a substrate 11. The substrate 11 may be a glass substrate or a plastic substrate. A source electrode 13 and a drain electrode 14 are insulated from the gate electrode 12. A gate wire 12a is used to apply a gate signal to the gate electrode 12. A wire 13a is connected to the source electrode 13. As shown in FIGS. 3 and 4, the source electrode 13 and the drain electrode 14 can overlap the gate electrode 12, but the present invention is not limited to this configuration.

A channel region 16a is insulated from the gate electrode 12 and electrically connected with the source electrode 13 and the drain electrode 14. A semiconductor layer 16 including a groove 15 separating at least the channel region 16a from adjacent thin film transistors is formed.

A gate insulating film 18 may cover the gate electrode 12 such that the source electrode 13, the drain electrode 14 and the semiconductor layer 16 are insulated from the gate electrode 12.

The semiconductor layer 16 includes the channel region 16a, which electrically connects the source electrode 13 and the drain electrode 14. In one embodiment, the region of the semiconductor layer 16 which contacts the source electrode 13 and the drain electrode 14 is doped with n-type or p-type impurities. In another embodiment, the semiconductor layer 16 can be formed of an n-type or p-type semiconductor material or can be doped with the n-type or p-type impurities.

In one embodiment, the semiconductor layer 16 can be formed of an inorganic material or organic material. In the first embodiment, the semiconductor layer 16 is formed of an organic material.

In one embodiment, the inorganic material can include one of the following: CdS, GaS, ZnS, CdSe, CaSe, ZnSe, CdTe, SiC and Si.

In one embodiment, the organic material may include one of the following: polythiophene or a derivative thereof, polyparaphenylenvinylene or a derivative thereof, polyparaphenylene or a derivative thereof, polyfluorene or a derivative thereof, polythiophenevinlylene or a derivative thereof, and polythiophene-heterocyclic aromatic copolymer or a derivative thereof, as a high molecular organic material, or may be pentacene, tetracene, oligoacene of naphthalene or a derivative thereof, alpha-6-thiophene, oligothiophene of alpha-5-thiophene or a derivative thereof, phtalocyanine with or without metal or a derivative thereof, pyromellitic dianhydride or a derivative thereof, pyromellitic diimide or a derivative thereof, perylenetetracarboxylic acid dianhydride or perylenecarboxylic diimide or a derivative thereof as a low molecular organic material.

In the semiconductor layer 16, the groove 15 has a predetermined pattern and separates the channel region 16a from the adjacent thin film transistors. Accordingly, the patterning effect which separates the channel region 16a from the adjacent thin film transistors by the groove 15 can be obtained without a patterning process such as photolithography.

As mentioned above, when using the organic semiconductor layer, it is not preferable to perform the patterning process because the organic material can be significantly damaged. However, in embodiments of the invention, since the patterning effect is obtained by separating the channel region 16a from the adjacent thin film transistors by the groove 15, a separate patterning process is not required. Also, since the patterning effect is obtained by the groove 15, the portion of the semiconductor layer 16 except for the channel region 16a need not be etched and the processing time can be shortened and the efficiency can be improved. Also, since a wet or dry etching process accompanying the patterning process is removed, the process is simplified and the characteristic of the thin film transistor can be improved.

As discussed above, the groove 15 can be simply formed with the use of the laser ablation method. That is, referring to FIGS. 3 and 4, after forming the semiconductor layer 16, a laser having a predetermined intensity is radiated onto any portion of the semiconductor layer 16 to etch only the portion of the semiconductor layer 16. The method of forming the groove 15 is not necessarily limited to the laser ablation method and any method in which the groove 15 can be simply formed can be used.

A stop layer 17 is formed below the semiconductor layer 16. In one embodiment, as shown in FIGS. 3 and 4, the stop layer 17 is formed only below the groove 15 or a periphery thereof. In embodiments of the invention, the stop layer 17 is formed on at least the portion below the groove 15 or a periphery thereof on which the laser will be radiated. In another embodiment, the stop layer 17 may be formed on the entire surface of the substrate 11.

In one embodiment, any material can be used as a stop layer as long as the groove 15, having a uniform width or a uniform depth, is produced. Thus, in embodiments of the invention, the failure of the thin film transistor is prevented and the characteristics of the thin film transistor are uniform.

In one embodiment, the depth of the groove 15 can be less than thickness of the semiconductor layer 16, as shown in FIG. 4. In one embodiment, the depth of the groove 15 is determined such that the carrier, allowing the current flow between the source electrode 13 and the drain electrode 14, can be blocked at the channel region 16a of the semiconductor layer 16 by the groove 15.

The depth of the groove 15 is not limited to the example shown in FIG. 4. For example, according to a second embodiment of the present invention shown in FIG. 5, the depth of a groove 25 may be substantially equal to the thickness of a semiconductor layer 26. In this embodiment, a stop layer 27 is exposed through the upper portion of the semiconductor layer 26 by the groove 25.

Figure 5:
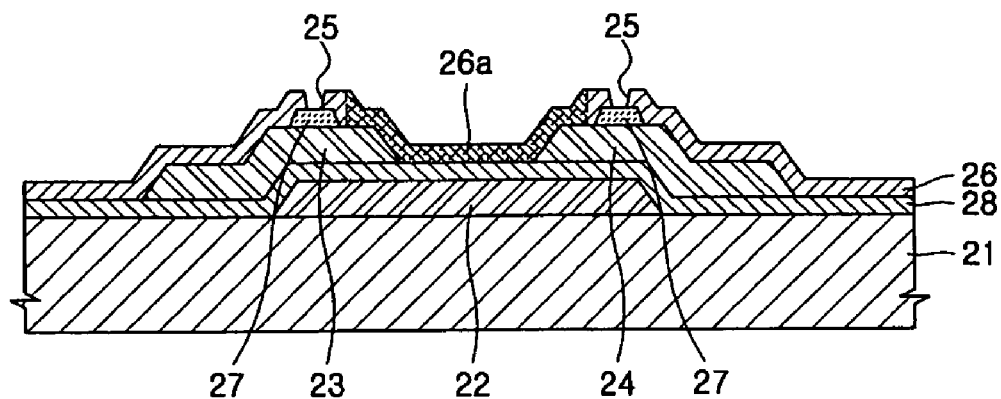
FIG. 5 is a cross-sectional view of an inverted coplanar thin film transistor according to another exemplary embodiment of the present invention.
Figure 6:
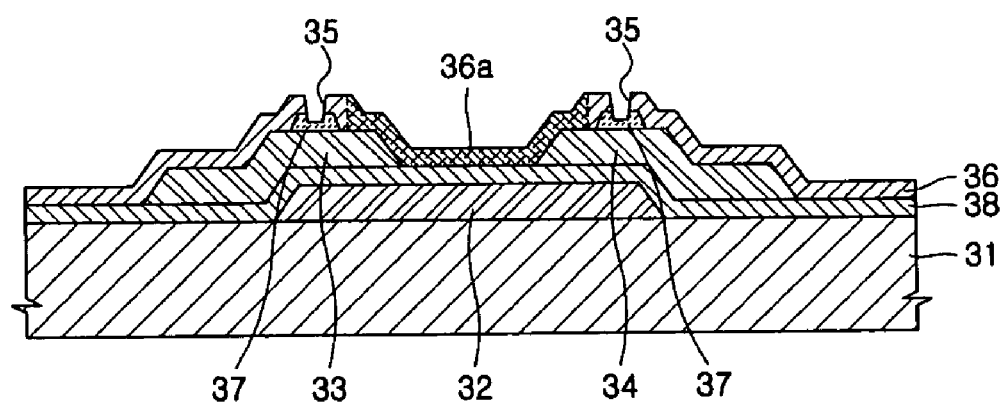
FIG. 6 is a cross-sectional view of an inverted coplanar thin film transistor according to another exemplary embodiment of the present invention.
Figure 7:
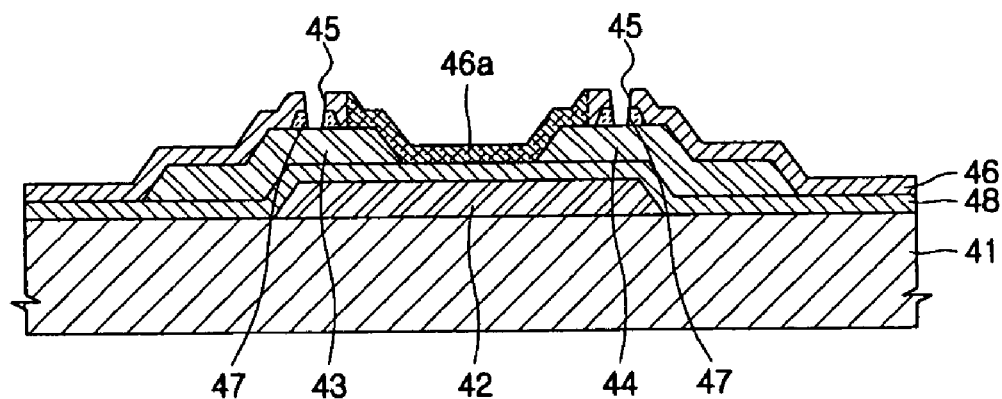
FIG. 7 is a cross-sectional view of an inverted coplanar thin film transistor according to another exemplary embodiment of the present invention.

Also, according to a third embodiment of the present invention shown in FIG. 6, the depth of a groove 35 may be greater than the thickness of a semiconductor layer 36 and may be less than the sum of the thickness of the semiconductor layer 36 and the thickness of a stop layer 37. Alternatively, according to a fourth embodiment shown in FIG. 7, the depth of a groove 45 may be substantially equal to the sum of the thickness of a semiconductor layer 46 and the thickness of a stop layer 47. In still another embodiment, the groove 45 may reach a gate insulating film 48 due to an over-etching. In FIGS. 5 through 7, reference numerals 28, 38 and 48 represent a gate insulating film. Furthermore, reference numerals 21, 31 and 41 represent a substrate.

The grooves 15, 25, 35, 45 are formed such that channel regions 16a, 26a, 36a, 46a of the thin film transistors are accommodated therein and can be formed in various shapes as illustrated in the modifications shown in FIGS. 8 through 14. In FIGS. 8 through 14, a gate wire 12a is used to apply a gate signal to the gate electrode 12 and a wire 13a is connected to the source electrode 13. A wire connected to the drain electrode 14 is not shown. Also, in FIGS. 8 through 14, for convenience, the stop layer is not shown.

Figure 8:
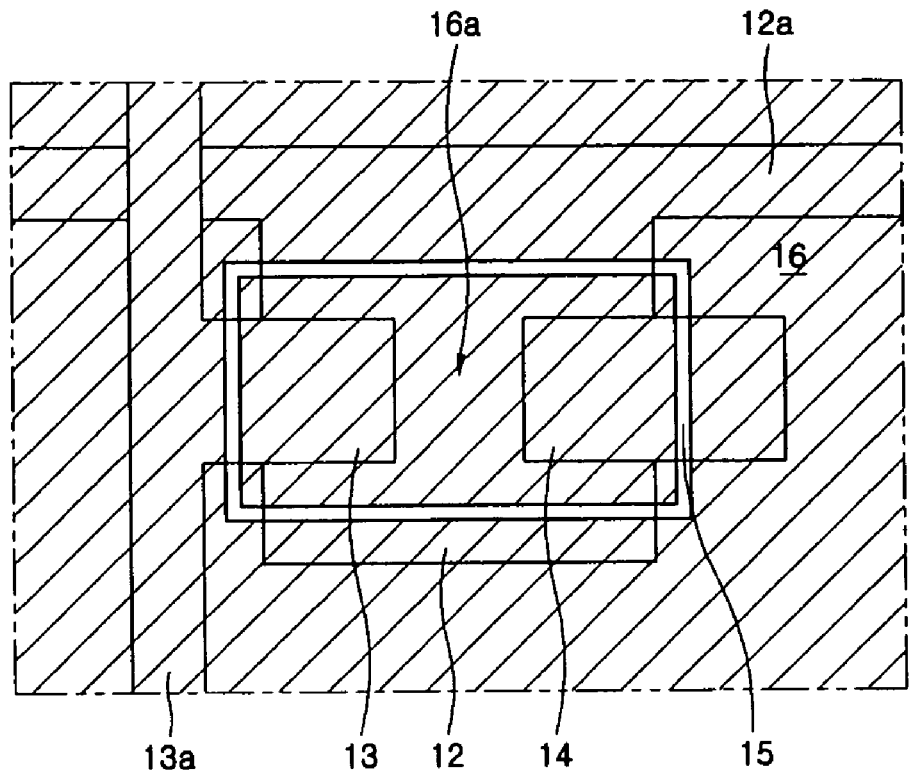
FIGS. 8 through 14 are plan views of thin film transistors according to embodiments of the invention.
Figure 9:
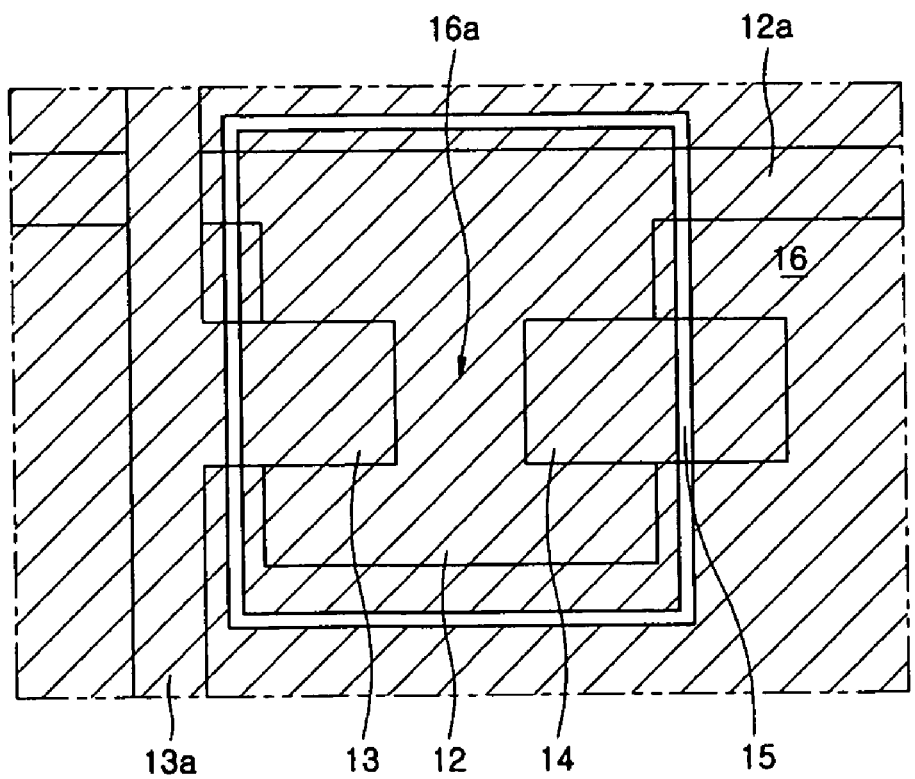

In one embodiment, as shown in FIGS. 8 and 9, the groove 15 forms a closed curve and the channel region 16a is located within the closed curve formed by the groove 15. The groove 15 forming the closed curve may overlap the gate electrode 12 at any point, as shown in FIG. 8, and may be formed at the outside of the gate electrode 12, as shown in FIG. 9. In the FIG. 8 embodiment, the groove 15 does not overlap the gate wire 12a. In the FIG. 9 embodiment, the groove 15 overlaps the gate wire 12a.

Figure 10:
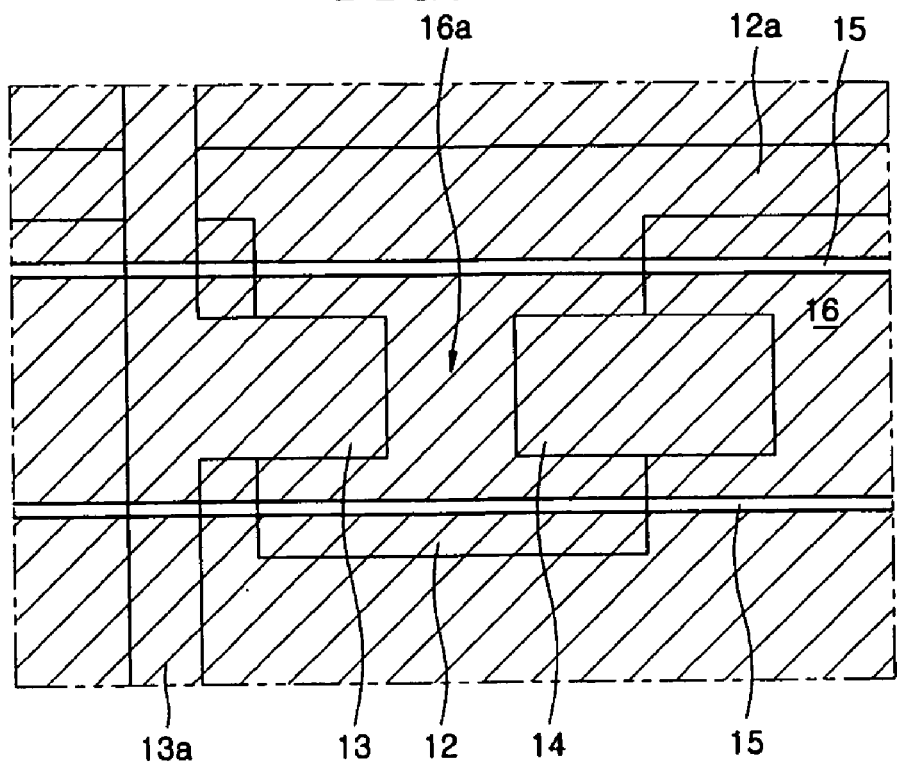
Figure 11:
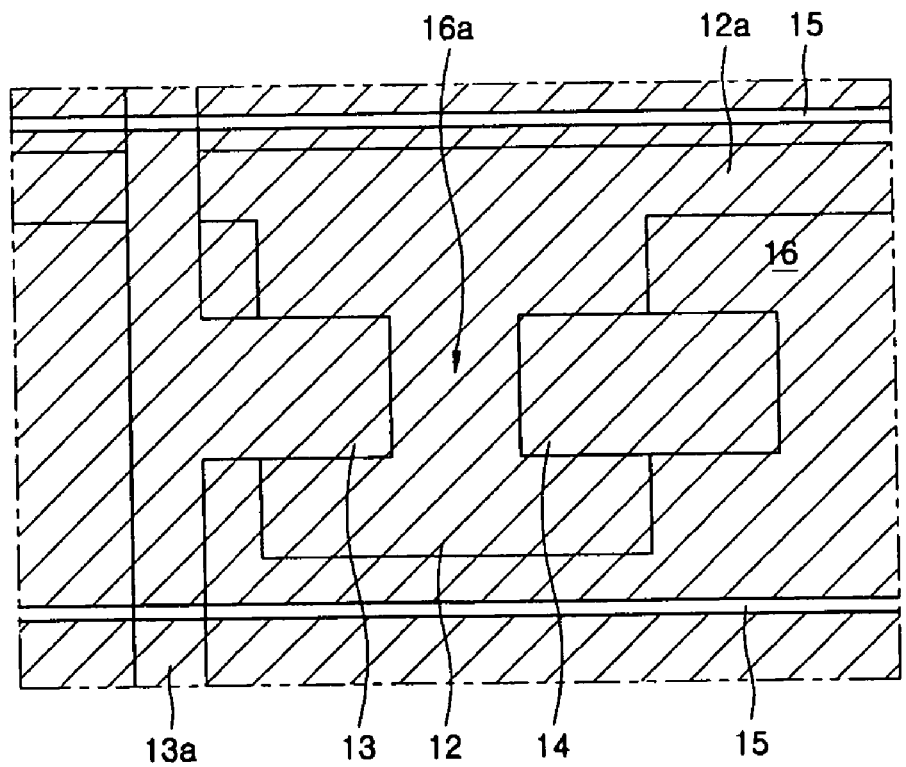
Figure 12:
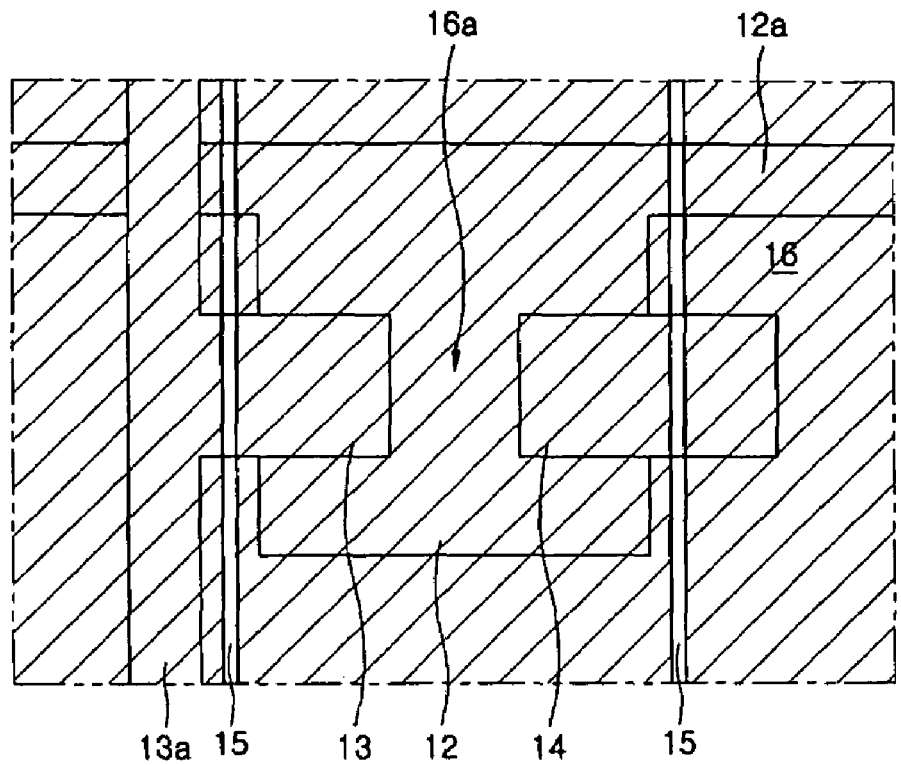
Figure 13:
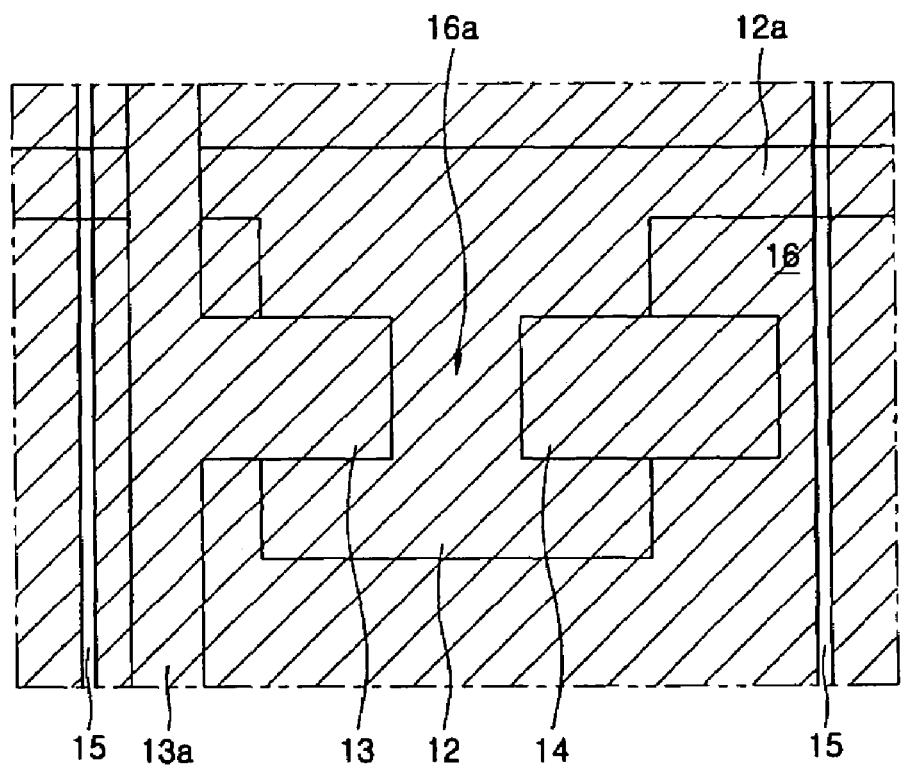

As shown in FIGS. 10 through 13, the groove 15 may be formed in a pair of parallel lines. In this case, the channel region 16a is located between the parallel grooves 15. The pair of parallel lines may be parallel to the gate wire 12a, as shown in FIGS. 10 and 11, and may be parallel to the wire 13a connected to the source electrode 13, as shown in FIGS. 12 and 13.

In one embodiment, the groove 15 may be located on the side of the gate wire 12a across the gate electrode 12, as shown in FIG. 10, or may be formed on the opposite side of the gate wire 12a and the gate electrode 12, as shown in FIG. 11.

In another embodiment, the groove 15 may be formed across the source electrode 13 or the drain electrode 14, as shown in FIG. 12, and may be formed at the outside of the source electrode 13 or the drain electrode 14, as shown in FIG. 13.

Figure 14:
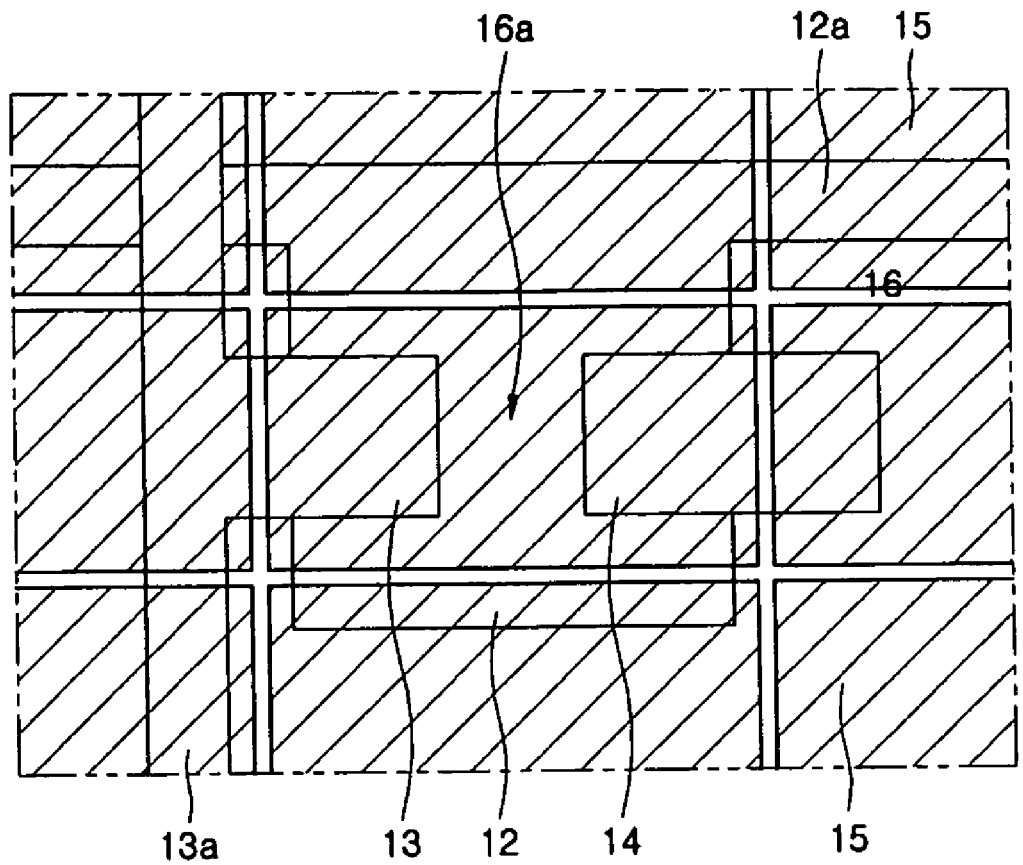

In still another embodiment, the groove 15 may be formed in two pairs of parallel lines, as shown in FIG. 14. In this case, the channel region 16a is located between the two pairs of the parallel lines formed by the groove 15. A pair of the parallel lines are parallel to the gate wire 12a and another pair of parallel lines are parallel to the wire 13a connected to the source electrode 13. In still another embodiment, as shown in FIG. 14, the groove 15 may be formed across the gate electrode 12, the source electrode 13 and the drain electrode 14, or, alternatively, the groove 15 may be formed at the outside thereof.

In one embodiment, as shown in FIGS. 4 through 7, the stop layers 17, 27, 37, 47 are formed only below the grooves 15, 25, 35, 45 and the peripheries thereof, but the present invention is not limited to this configuration.

Figure 15:
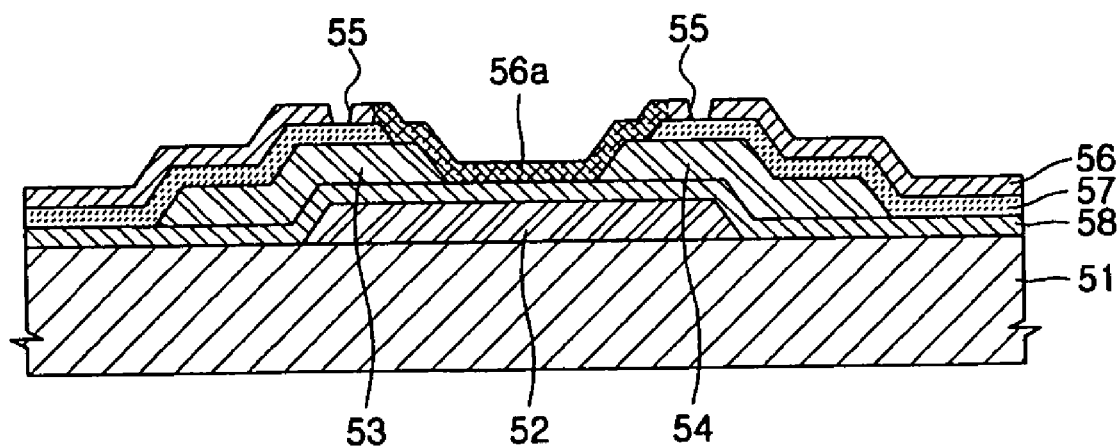
FIG. 15 is a cross-sectional view of an inverted coplanar thin film transistor according to another exemplary embodiment of the present invention.

That is, according to a fifth embodiment of the present invention shown in FIG. 15, a stop layer 57 is formed on the entire surface of a substrate 51 excluding a region between the source electrode 53 and a drain electrode 54 where a channel region 56a is formed.

Figure 16:
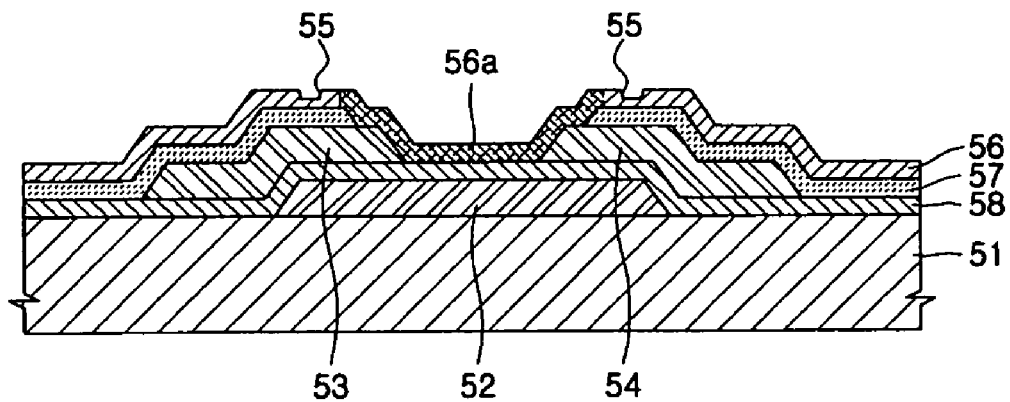
FIGS. 16 through 18 are cross-sectional views of inverted coplanar thin film transistors according to various modifications of FIG. 15.
Figure 17:
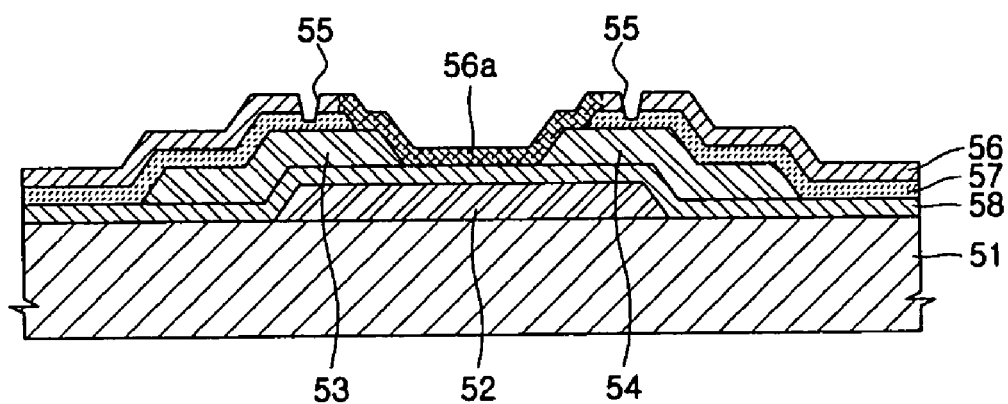
Figure 18:
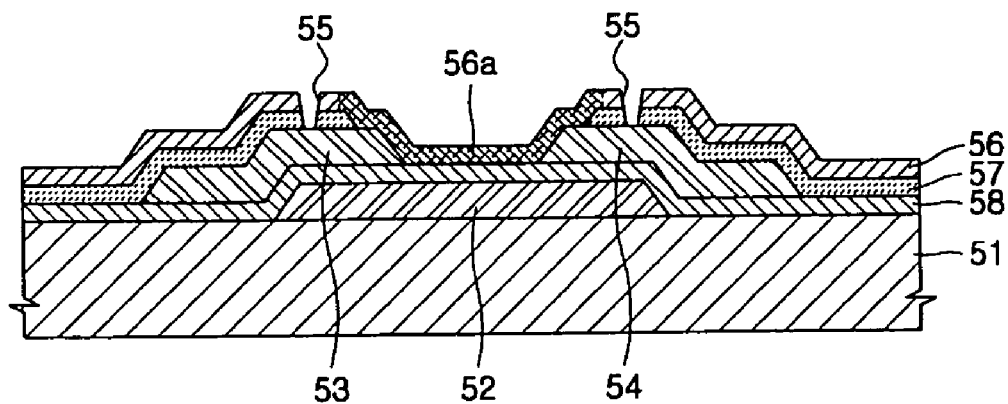

In one embodiment, as shown in FIG. 15, the depth of the groove 55 is substantially equal to the thickness of the semiconductor layer 56. In another embodiment, as shown in FIG. 16, the depth of the groove 55 is less than the thickness of the semiconductor layer 56. In another embodiment, as shown in FIG. 17, the depth of the groove 55 is greater than the thickness of the semiconductor layer 56 and is less than the sum of the thickness of the semiconductor layer 56 and the thickness of the stop layer 57. In still another embodiment, as shown in FIG. 18, the depth of the groove 55 is substantially equal to the sum of the thickness of the semiconductor layer 56 and the thickness of the stop layer 57. In those embodiments, the stop layer 57 can be formed on the entire surface of the substrate 51 excluding a region between the source electrode 53 and the drain electrode 54 where the channel region 56a is formed. This is also true for the embodiments described below. In FIGS. 15 through 18, reference numerals 52 and 58 represent a gate electrode and a gate insulating film, respectively.

Figure 19:
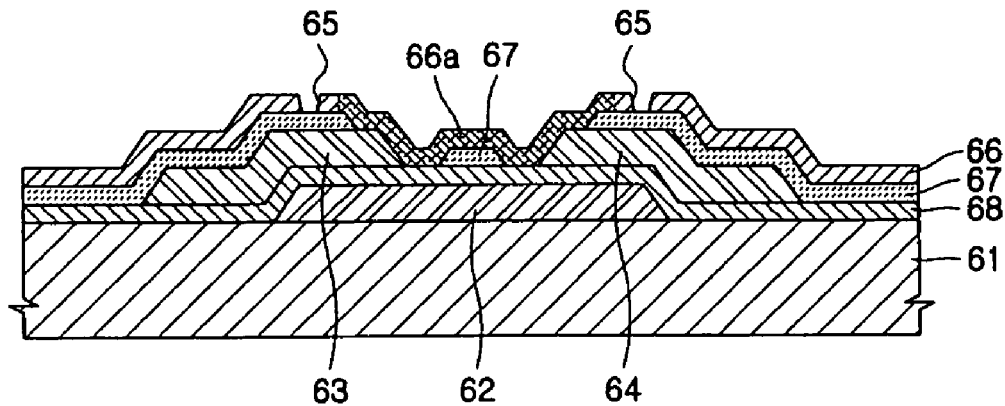
FIG. 19 is a cross-sectional view of an inverted coplanar thin film transistor according to another exemplary embodiment of the present invention.

According to a sixth embodiment shown in FIG. 19, a stop layer 67 is formed on the entire surface of the substrate 61 with openings corresponding to end portions of a source electrode 63 and a drain electrode 64. Here, the end portions face each other. In addition, various other modifications can be made. In FIG. 19, reference numerals 66 and 68 represent a semiconductor layer and a gate insulating film, respectively.

In FIGS. 3 through 19, an inverted coplanar thin film transistor is shown. That is, for example, in the thin film transistor of FIGS. 3 and 4, the source electrode 13, the drain electrode 14 and the channel region 16a are formed above the gate electrode 12 and the semiconductor layer 16 is formed to cover the source electrode 13 and the drain electrode 14, but the present invention is not limited to this structure. That is, the present invention can be applied to various thin film transistors such as a staggered thin film transistor and an inverted staggered thin film transistor.

Figure 20:
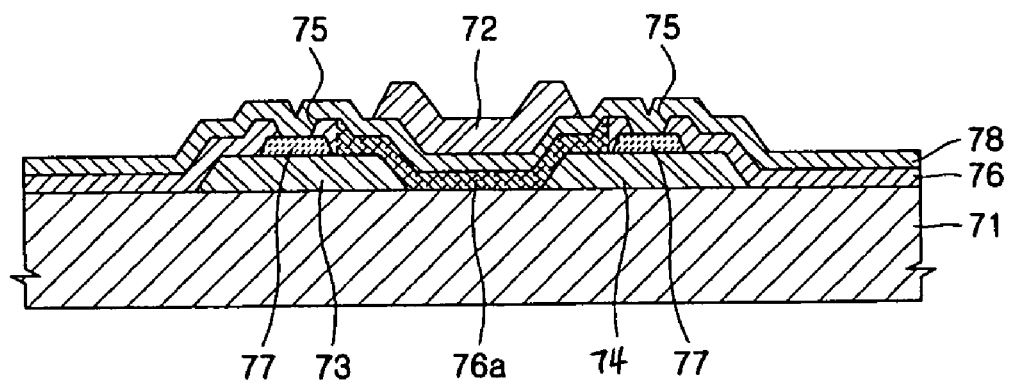
FIGS. 20 and 21 are cross-sectional views of staggered thin film transistors according to another exemplary embodiments of the present invention.

FIG. 20 is a cross-sectional view of a staggered thin film transistor according to a seventh embodiment of the present invention.

Referring to FIG. 20, a source electrode 73 and a drain electrode 74 are formed and a semiconductor 76 is formed on a substrate 71 to cover the source electrode 73 and the drain electrode 74. A groove 75 for separating a channel region 76a from the adjacent thin film transistors is formed in the semiconductor layer 76 and a stop layer 77 is formed below the groove 75. Also, a gate insulating film 78 is formed to cover the semiconductor layer 76 and a gate electrode 72 is formed on the gate insulating film 78 above the channel region 76a.

Figure 21:
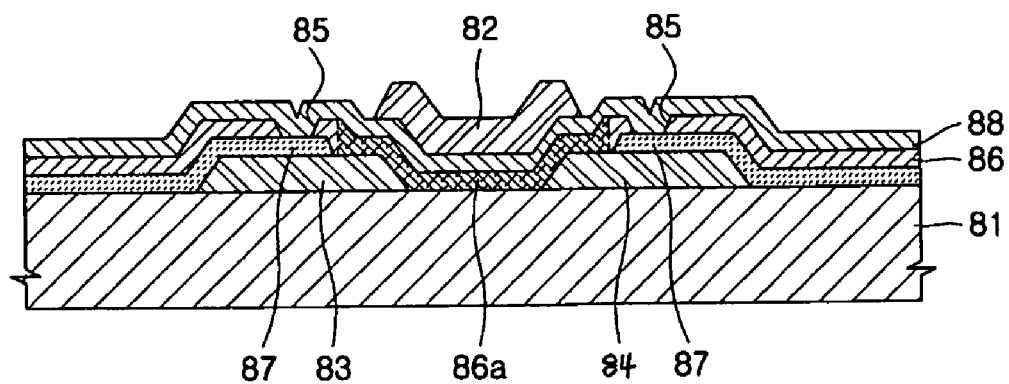

As mentioned above, the present invention can be applied to the staggered thin film transistor, but is not limited to that shown in FIG. 20. According to an eighth embodiment of the present invention as shown in FIG. 21, a stop layer 87 is formed on the entire surface of a substrate 81 except for a region between a source electrode 83 and a drain electrode 84 where a channel region 86a is formed. The modifications which are applied to the inverted coplanar thin film transistor can be also applied to the staggered coplanar thin film transistor. In FIG. 21, reference numerals 82 and 85 represent a gate electrode and a groove, respectively. Furthermore, reference numerals 86 and 88 represent a semiconductor layer and a gate insulating film, respectively.

Figure 22:
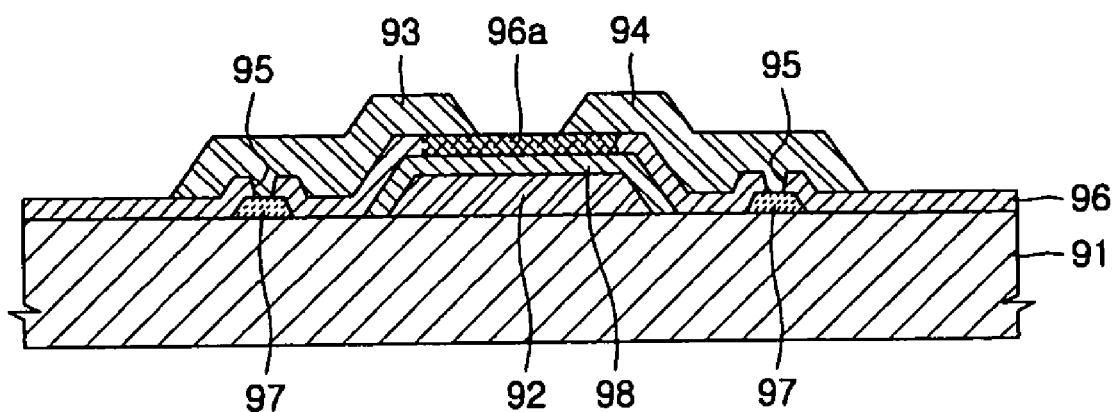
FIG. 22 is a cross-sectional view of an inverted staggered thin film transistor according to another exemplary embodiment of the present invention.

Also, according to a ninth embodiment of the present invention shown in FIG. 22 (an inverted staggered thin film transistor), if a gate insulating film 98 for covering a gate electrode 92 covers only the gate electrode 92, the material below a semiconductor layer 96 may vary. Accordingly, a stop layer 97 is formed. In this case, the stop layer 97 and the gate insulating film 98 may be formed of the same material. Even when the gate insulating film 98 is formed on the entire surface of a substrate 91, the stop layer 97 is formed such that a groove 95 can be easily formed using the laser ablation technique. According to an embodiment of the present invention, unlike in an inverted staggered thin film transistor shown in FIG. 22, the stop layer 97 may be formed on the entire surface of the substrate 91. In FIG. 22, reference numerals 93,
94 and 96a represent a source electrode, a drain electrode and a channel region, respectively.

The above mentioned stop layer may be a priming layer. As mentioned above, when forming the groove using the laser ablation technique, the material below the region to be irradiated varies, and thus the grooves are not uniformly formed. Accordingly, in embodiments of the present invention, the stop layer may be formed as a priming layer so that the portions below the region to be irradiated have uniform characteristics. That is, the stop layer is formed as the priming layer which is cracked when radiating the light or applying the heat, so that the grooves can be uniformly formed. In one embodiment, the groove is formed by radiating a laser beam onto the semiconductor such that the priming layer below the region on which the laser is radiated is cracked at the same time or before the laser reaches the priming layer. Accordingly, grooves having uniform characteristics can be more easily formed. When forming the groove using the laser ablation method, the depth of the groove can be greater than the thickness of the semiconductor layer and less than or equal to the sum of the thickness of the semiconductor layer and the thickness of the priming layer. When removing only a portion of the priming layer below the region of the semiconductor layer on which the laser is radiated, the depth of the groove is less than the sum of the thickness of the semiconductor layer and the thickness of the priming layer. When removing the entire priming layer, the depth of the groove is equal to the sum of the thickness of the semiconductor layer and the thickness of the priming layer.

If the priming layer is formed over the entire surface, it may be formed by spin coating or deposition. If the priming layer is formed only on a certain area, it may be formed by deposition with a mask, or ink-jet printing. In this embodiment, the priming layer may be formed of one of the following: Lewis acid such as TBPAH or tris(4-bromophenyl)aminium haxachloroantimonate, or may be made of organic materials having an organic acceptor such as 4-Nitroaniline, 2,4-dinitronapthalene, 2-Amino-5-nitrobenzonitrile, 9,10-dicyanoanthracene, 2,4-dinitrophenylamine, or 2,4-dinitroaniline. In another embodiment, other materials which are sensitive to and cracked by an incident laser beam may be also used. The structure of the thin film transistor according to the embodiments having the stopper layer can be applied to the thin film transistor having the priming layer.

In one embodiment, the above-mentioned thin film transistors can be included in a flat panel display device such as a liquid crystal display device or an organic electroluminescent display device.

That is, the thin film transistors may be used as switching thin film transistors or driving thin film transistors of a flat panel display device or may be used as thin film transistors of various drivers.

When using the thin film transistor as a driving thin film transistor, a pixel electrode of the flat panel display device may be connected to any one of the source electrode and the drain electrode.

Particularly, the thin film transistor according to embodiments of the present invention can be used in the organic electroluminescent display device.

The organic electroluminescent display device has various pixel patterns according to the emitting color of the electroluminescent element and preferably has red, green and blue sub-pixels.

The red, green and blue sub-pixels have electroluminescent elements and the thin film transistor according to the above-mentioned embodiments.

The electroluminescent element emits red, green or blue light according to current flow to display predetermined image information and includes a pixel electrode connected to any one of the source electrode and the drain electrode of the above-mentioned thin film transistor, an opposing electrode for covering all the pixels and an organic electroluminescent film interposed between the pixel electrode and the opposing electrode. The present invention is not limited to the above-mentioned structures and can be applied to the structures of various organic electroluminescent display devices.

The above-described low-molecular or high-molecular organic film can be used as the organic electroluminescent film. When using the low molecular organic film, a hole injection layer (HIL), a hole transport layer (HTL), an emission layer (EML), an electron transport layer (ETL), an electron injection layer (EIL) or a combination thereof is laminated. Copper phthalocyanine (CuPc), N,N'-Di(naphthalene-1-yl)-N,N'-diphenyl-benzidine (NPB), or tris-8-hydroxyquinoline aluminum (Alq3) may be used as an organic material. The low-molecular organic film is formed by vapor deposition.

When using the high-molecular organic film, a hole transport layer (HTL) and an emission layer (EML) can be used. In this case, PEDOT is used as the hole transport layer and PPV (Poly-Phenylenevinylene) system and Polyfluorene system high-molecular organic material are used to form the emission layer. The HTL and EML can be formed by screen printing or inkjet printing.

The organic film is not limited to the above-mentioned organic film and various modifications can be applied thereto.

The pixel electrode functions as an anode electrode and the opposing electrode functions as a cathode electrode. The pixel electrode and the opposing electrode are opposite to each other in polarity.

The pixel electrode may be used as a transparent electrode or a reflective electrode. When the pixel electrode is used as the transparent electrode, it may be composed of ITO, IZO, ZnO or $In_2O_3$. When the pixel electrode is used as the reflective electrode, a reflection film formed of Ag, Mg, Al, Pt, Pd, Au, Ni, Nd, Ir, Cr or a compound thereof is formed and then ITO, IZO, ZnO or $In_2O_3$ is formed thereon. The opposing electrode may be also used as a transparent electrode or a reflective electrode. When the opposing electrode is used as the transparent electrode, a metal having a small work function, that is, Li, Ca, LiF/Ca, LiF/Al, Al, Ag, Mg or a compound thereof, is deposited the organic electroluminescent film and then a subsidiary electrode layer or a bus electrode line is formed from the material for forming the transparent electrode, such as ITO, IZO, ZnO or $In_2O_3$. When the pixel electrode is used as the reflective electrode, Li, Ca, LiF/Ca, LiF/Al, Al, Ag, Mg or a compound thereof can be used. However, the present invention is not limited to this, and organic material such as a conductive polymer may be used to form the pixel electrode and the opposing electrode.

In the case of the liquid crystal display device, the manufacturing of the lower substrate of the liquid crystal display device is completed by forming a lower polarization film for covering the pixel electrode.

The thin film transistor according to embodiments of the present invention can be mounted on the sub-pixel and can be mounted on a driver circuit which does not provide the image.

As mentioned above, the thin film transistor and the flat panel display device according to embodiments of the present invention can obtain the following advantages.

First, the channel region can be separated from the adjacent thin film transistors by the groove, without performing a separate patterning process such as photolithography, and thus a complicated patterning process can be omitted.

Second, a dry or wet etching process is unnecessary and thus deterioration of the characteristics of the active channel can be minimized.

Third, since the patterning effect can be obtained by only the groove, the processing time can be shortened and the efficiency can be improved. Also, since a dry or wet etching process is unnecessary, the manufacturing process can be simplified and efficiency can be improved.

Fourth, the leakage current can be reduced by separating the channel region from the adjacent thin film transistors by way of the groove.

Fifth, a groove having a uniform width and depth can be formed by forming the stop layer below the groove or the periphery thereof.

Seventh, the flat panel display device including the thin film transistors having uniform characteristics in all pixels can be manufactured and thus an image can be more accurately and clearly reproduced since the grooves have uniform widths and depths.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A thin film transistor, comprising:
a substrate;
a gate electrode formed on the substrate;
a source electrode and a drain electrode insulated from the gate electrode;
a semiconductor layer insulated from the gate electrode and including: i) a channel region which is electrically connected to the source electrode and the drain electrode, and ii) a groove configured to separate at least the channel region from adjacent thin film transistors; and
a stop layer formed below the semiconductor layer.

2. The thin film transistor according to claim 1, wherein the depth of the groove is greater than the thickness of the semiconductor layer and is less than the sum of the thickness of the semiconductor layer and the thickness of the stop layer.

3. The thin film transistor according to claim 1, wherein the stop layer is formed only below the groove and a periphery thereof.

4. The thin film transistor according to claim 1, wherein the stop layer is formed on the entire surface of the substrate except for a region between the source electrode and the drain electrode where the channel region is formed.

5. The thin film transistor according to claim 1, wherein the stop layer is formed on the entire surface of the substrate except for regions corresponding to end portions of the source electrode and the drain electrode, the end portions facing each other.

6. The thin film transistor according to claim 1, wherein the depth of the groove is substantially equal to the sum of the thickness of the semiconductor layer and the thickness of the stop layer.

7. The thin film transistor according to claim 6, wherein the stop layer is formed only below the groove and a periphery thereof.

8. The thin film transistor according to claim 6, wherein the stop layer is formed on the entire surface of the substrate except for the groove and a region between the source electrode and the drain electrode where the channel region is formed.

9. The thin film transistor according to claim 6, wherein the stop layer is formed on the entire surface of the substrate except for the groove and regions corresponding to end portions of the source electrode and the drain electrode, the end portions facing each other.

10. The thin film transistor according to claim 1, wherein the groove forms a closed curve.

11. The thin film transistor according to claim 10, wherein the channel region is located inside the closed curve.

12. The thin film transistor according to claim 11, further comprising a gate insulating film covering the gate electrode to insulate the source electrode, the drain electrode and the semiconductor layer from the gate electrode, wherein the source electrode, the drain electrode and the channel region are formed on the gate electrode, and wherein the semiconductor layer covers the source electrode and the drain electrode.

13. The thin film transistor according to claim 1, wherein the groove forms at least a pair of parallel lines.

14. The thin film transistor according to claim 13, wherein the channel region is located between the at least one of the pairs of the parallel lines.

15. The thin film transistor according to claim 1, wherein the semiconductor layer is formed of an organic material.

16. The thin film transistor according to claim 1, further comprising a gate insulating film that insulates the gate electrode from the semiconductor layer and is interposed between the gate electrode and the semiconductor layer, wherein the semiconductor layer covers the source electrode and the drain electrode, and wherein the gate electrode is formed on the semiconductor layer.

17. The thin film transistor according to claim 1, wherein the stop layer is
    formed as a priming layer which is cracked when irradiated with light or when heat is applied thereto.

18. The thin film transistor according to claim 17, wherein the stop layer is
    formed of organic materials having an organic acceptor selected from the group consisting of 4-Nitroaniline, 2,4-dinitronapthalene, 2-Amino-5-nitrobenzonitrile, 9,10-dicyanoanthracene, 2,4-dinitrophenylamine, and 2,4-dinitroaniline.

19. The thin film transistor according to claim 1, wherein each of the source and drain electrodes comprises bottom and top portions, wherein the bottom portions are closer to the substrate than the top portions, and wherein the stop layer contacts one of i) the bottom portions and ii) top portions of the source and drain electrodes.

* * * * *